(12) United States Patent
Wityak et al.

(10) Patent No.: US 9,334,563 B2
(45) Date of Patent: *May 10, 2016

(54) DIRECT COOLED ROTARY SPUTTERING TARGET

(71) Applicant: Materion Advanced Materials Technologies and Services Inc., Buffalo, NY (US)

(72) Inventors: George Michael Wityak, Albuquerque, NM (US); Luther Wilburn Cox, Albuquerque, NM (US)

(73) Assignee: Materion Corporation, Mayfield Heights, OH (US)

( * ) Notice: Subject to any disclaimer, the term of this patent is extended or adjusted under 35 U.S.C. 154(b) by 602 days.

This patent is subject to a terminal disclaimer.

(21) Appl. No.: 13/757,000

(22) Filed: Feb. 1, 2013

(65) Prior Publication Data

US 2013/0192981 A1    Aug. 1, 2013

Related U.S. Application Data

(63) Continuation-in-part of application No. 13/179,825, filed on Jul. 11, 2011, now Pat. No. 9,011,652.

(60) Provisional application No. 61/678,176, filed on Aug. 1, 2012, provisional application No. 61/363,308, filed on Jul. 12, 2010.

(51) Int. Cl.
*C23C 14/34* (2006.01)
*B23K 37/04* (2006.01)
*H01J 37/34* (2006.01)

(52) U.S. Cl.
CPC ......... *C23C 14/3407* (2013.01); *B23K 37/0443* (2013.01); *H01J 37/342* (2013.01); *H01J 37/3435* (2013.01); *Y10T 156/1062* (2015.01)

(58) Field of Classification Search
CPC ............ B23K 37/0443; C23C 14/3407; H01J 37/342; H01J 37/3435; Y10T 156/1062
USPC ............. 204/192.12, 298.12, 298.13, 298.21, 204/298.22, 298.09; 156/256; 228/170
See application file for complete search history.

(56) References Cited

U.S. PATENT DOCUMENTS 6,365,010 B1    4/2002  Hollars
6,409,897 B1    6/2002  Wingo
(Continued)

FOREIGN PATENT DOCUMENTS

DE    102006017455 A1    10/2007
EP         1813695 A1     8/2007
(Continued)

OTHER PUBLICATIONS

Prior Art Search Results from related Japanese Application No. 2013-519740, dated Feb. 10, 2014.
(Continued)

*Primary Examiner* — Rodney McDonald
(74) *Attorney, Agent, or Firm* — Richard M. Klein; Fay Sharpe LLP

(57) ABSTRACT

A rotary deposition target bonded to a backing tube such that the bonding material is applied only at the ends of the rotary target to form a gap between the rotary target and the backing tube to enable a target cooling fluid used during the deposition process to contact the target directly and to provide a hermetic seal to contain the cooling fluid within the gap and prevent the fluid from being exposed to the environment within the deposition chamber.

20 Claims, 3 Drawing Sheets

(56) References Cited

U.S. PATENT DOCUMENTS

| | | |
|---|---|---|
| 6,787,011 B2 | 9/2004 | Ueda et al. |
| 7,922,066 B2 | 4/2011 | Nolette et al. |
| 9,011,652 B2 * | 4/2015 | Wityak et al. ............ 204/298.09 |
| 2002/0096430 A1 | 7/2002 | Lupton et al. |
| 2006/0157346 A1 | 7/2006 | Cnockaert et al. |
| 2007/0023275 A1 | 2/2007 | Tanase et al. |
| 2007/0074969 A1 | 4/2007 | Simpson et al. |
| 2009/0250337 A1 | 10/2009 | Simons et al. |
| 2011/0005923 A1 | 1/2011 | Schnappenberger et al. |
| 2011/0005925 A1 | 1/2011 | Schnappenberger et al. |
| 2011/0240467 A1 | 10/2011 | Itoh et al. |

FOREIGN PATENT DOCUMENTS

| | | |
|---|---|---|
| EP | 2163662 A1 | 3/2010 |
| JP | H02-209476 A | 8/1990 |
| JP | 3974541 B | 9/2003 |
| JP | 2005-520935 A | 7/2005 |
| JP | 2008-505250 A | 2/2008 |
| JP | 4775184 B | 3/2008 |
| JP | 2009-513818 A | 4/2009 |
| JP | 2010-070842 A | 4/2010 |
| JP | 2010-100930 A | 5/2010 |
| WO | 2007/041425 A2 | 4/2007 |
| WO | 2009/036910 A1 | 3/2009 |

OTHER PUBLICATIONS

International Search Report from related European Patent Application No. EP 11 80 7344, dated May 12, 2014.

International Search Report for related PCT Application No. PCT/US2013/052519, dated Oct. 18, 2013.

* cited by examiner

DIRECT COOLED ROTARY SPUTTERING TARGET

CROSS-REFERENCED APPLICATION

This application is a continuation-in-part of and claims the benefit of co-pending U.S. application Ser. No. 13/179,825, filed Jul. 11, 2011, Wityak et. al. and entitled Rotary Target Backing Tube Bonding Assembly, and further claims priority to U.S. Provisional Patent Application No. 61/678,176, filed Aug. 1, 2012.

FIELD OF THE INVENTION

The invention relates to the field of rotary targets for depositing such as by sputtering thin layers of a material from a target onto a substrate. More particularly, the invention relates to rotary target assemblies having supporting backing tubes.

BACKGROUND OF THE INVENTION

As described in co-owned European Patent No. EP1813695 (De Bosscher et al) and co-pending U.S. application Ser. No. 13/179,825 ("the '825 Application"), the entire disclosures of which are incorporated by reference, rotary sputtering targets are used for coating large surface areas of substrates with thin films of various materials, by bombarding the target in a closed inert atmosphere chamber with negative ions to dislodge atoms of the target material for deposition onto the surface of a substrate positioned in and/or moved through the chamber at a controlled rate. If not in an enclosed chamber, the negative ions can be retained in a space between the target and the substrate by maintaining a magnetic field just above the target surface, by a process known as magnetron sputtering. Such rotary targets typically are tubular in shape and may have lengths up to 152 inches. Depending on the properties of the target material, a cylindrical backing tube may be positioned inside rotary target to support the target, and through which backing tube a cooling fluid (often water) is circulated during the sputtering process to prevent the target from becoming excessively heated.

Rotary thin film deposition targets, whether used in physical or chemical vapor deposition processes, have been shown to improve the deposition process. By rotating the target during the deposition process, the target material is applied in a more continuous uniform fashion to larger substrate surfaces than might planar sputtering targets.

If for example a material that is to be deposited by sputtering is soft or malleable and has a high weight to strength ratio, such as silver or gold, the rotary sputtering target as the material is being sputtered away becomes thinner and thus is more likely to flex or break during rotation. To alleviate this problem, such rotary sputtering targets typically are supported by a backing tube able to resist target flexing. The backing tube allows for more of the target material to be sputtered without deformation of the target and therefore enables higher yields when compared to systems lacking a backing tube.

Backing tubes usually are formed from materials that have a lower cost than the target material and that can withstand the deposition process while retaining its shape. Generally, backing tube materials should have high thermal conductive properties, which is especially important for rotary target materials having low melting points. Backing tube materials having a low thermal conductivity could result in a thermal gain that would lead to an incipient melting situation, resulting in an electrical or electrostatic short in the deposition process, dangerous arcing within the system, premature target failure and damage to the substrate. Backing tubes should also have the rigidity and strength to support the target material, a liquid cooling fluid such as water, and a magnet array internal to the tube to minimize bending of the assembly when supported on one or both ends.

A rotary deposition target and backing tube assembly can be made by casting or spraying the deposition material onto the backing tube, if the sputtering material is castable or sprayable. Casting or spraying will have a number of drawbacks with specific substrates, and can be detrimental to deposition systems, as they often result in variable grain sizes, leading to less consistent deposition, and will have an inherent porosity that is created from the volume changes in the liquid to solid transition during casting or spraying.

The rotary deposition target and backing tube assembly may include, for example, a sleeve positioned between the target and backing plate substantially along the full length of the target, which sleeve may be either thermally conductive or thermally reflective depending on the material to be deposited and the deposition equipment used. However, during the deposition process, the heat that is generated at the outer surface of the target during deposition is then transferred into the bulk of the target through to the inner surfaces of the target. If the thermal expansion of the target relative to the backing tube causes the target and/or sleeve to lose physical contact with the backing tube, much of the cooling effect achieved by the physical contact with the backing tube will be lost and the differential thermal expansion increased even more.

Although the descriptions that follow are for rotary sputtering target and backing tube assemblies and the sputtering process, it is to be understood that the embodiments as are illustrated and described can be used in analogous other plasma vapor deposition and treatment processes.

A prior art rotary sputtering target and backing tube assembly is made by use of a bonding material as illustrated schematically in FIG. 1, in which a pre-formed rotary sputtering target 10 is positioned over and fixed to a backing tube 12 by bonding material 11 extending in a continuous fashion along the entire length of the target from its first end 13 to its second end 14. The depth of bonding material 11 usually is negligible, in that only a minimum amount of bonding material is needed to affix target 10, but solely for illustrative purposes is exaggerated in FIG. 1. As the bonding material, an adhesive or bonding alloy such as indium or an indium-tin alloy is inserted between the inner surface of the rotary sputtering target 10 and the outer surface of the backing tube 12 to create a strong bond between the two surfaces. Care must be taken when pouring the adhesive between the sputtering target and the backing tube to ensure the minimal uniform spacing between them for the adequate bonding strength. Reuse of the backing tube and of remaining target material in pure form after the target has been used in the sputtering process may be compromised when separated from each other and from the bonding material.

An improved method for cooling the sputtering target during sputtering is to perforate the backing tube, as disclosed in the co-owned European Patent No. EP 1813695 to De Bosscher et al. As explained in that patent, perforations in the backing tube allow for partial direct contact of the cooling fluid with some of the target's inner surface and thus enhance somewhat the thermal transfer. If direct contact of the cooling fluid with the target is not desired, a thin membrane or sleeve that is leak proof and thermally conductive may be used between the target material and the backing tube, still enabling a higher thermal transfer than is possible if the backing tube were not perforated. Sleeves having vacuum and water sealing properties may be used both to support/fix the target in place and to prevent leakage of the cooling fluid from the interior of the backing tube. Having a low cost and high weight to strength ratio perforated backing tube that can enable a more direct cooling of a target is desired, provided that a reliable bond nevertheless is achieved.

SUMMARY OF THE INVENTION

The invention comprises, in a preferred form, a rotary sputtering target bonded to a backing tube such that the bonding material is applied only proximate the ends of the rotary sputtering target and still sufficient for a rigid bond, but also to form a fluid tight gap of optimal depth along the entire circumference of the target between the bonded ends of the sputtering target and the backing tube.

The invention includes a backing tube having one or preferably more perforations to improve substantially the thermal transfer for cooling the rotary target during the sputtering process, by allowing the cooling fluid during sputtering to pass into the gap through the perforations and thus enabling a more effective heat transfer by the cooling fluid flowing through the gap to directly contact the entire inside circumferential surface area of the target between its bonded ends.

In one embodiment of the invention, the rotary sputtering target assembly comprises an elongated tubular backing tube superimposed on which is a tubular rotary sputtering target preferably of somewhat lesser length and consisting essentially of the material to be sputtered onto a substrate to form a thin film of the material on the substrate. The backing tube has preferably a plurality of spaced perforations throughout the portion of its periphery in its surface area underneath the target other than at the two bonded ends of the target, with the rotary sputtering target having an inner diameter larger than the outer diameter of the perforated backing tube in order to form the gap of optimal depth between the backing tube and the target and through which a fluid liquid or gas coolant will flow in contact with the target during the sputtering process.

The invention may also comprise a method for manufacturing the rotary sputtering target assembly by including the steps of extruding or otherwise wrought forming of a target material into a hollow cylindrical shape having an inner surface, an outer surface and two ends; boring the inner surface of the extruded target at least at its ends to form a smooth bonding surface; sliding the extruded target onto a perforated tubular backing tube, the backing tube preferably having a length that is greater than the length of the extruded target and an outer diameter less than the inner diameter of the extruded target with a uniform annular gap between the backing tube and target; affixing the target to the perforated backing tube only at the ends of the target, with at least one of the ends of the backing tube extending beyond the end of the target to allow for attachment of the assembly to sputtering apparatus.

The invention further includes a method for sputtering a thin film onto a substrate and comprising the steps of installing in a sputtering chamber the tubular rotary sputtering target assembly as described in the preceding paragraph; rotating the target in an atmosphere in the sputtering chamber that causes atoms of the sputtering material to be dislodged from the target and deposited on a substrate passing under the target; and while sputtering flowing cooling fluid from within the backing tube through its perforations and into and through the gap to directly contact and cool the entire inner surface area of the sputtering target between its bonded ends.

Advantages of the present invention include the substantially improved thermal transfer of heat by the cooling fluid passing through the gap for substantial direct contact with the target, a sufficient seal at the target ends to prevent leakage of the cooling fluid from within the gap, and a more easily removed spent target from the backing tube for recycling of the material in the spent target.

A further and very important advantage of the present invention is the ability to achieve much faster thin film deposition rates in multi-station sputtering apparatus when sequentially depositing thin films of different materials in linear succession on an elongated or continuous length substrate moving though the multiple stations.

BRIEF DESCRIPTION OF THE DRAWINGS

The present invention is disclosed with reference to the accompanying drawings, wherein.

Corresponding reference characters indicate corresponding parts throughout the several views. The examples set out herein illustrate several embodiments of the invention for use in sputtering processes, but should not be construed as limiting the scope of the invention as claimed.

DETAILED DESCRIPTION

Figure 1:
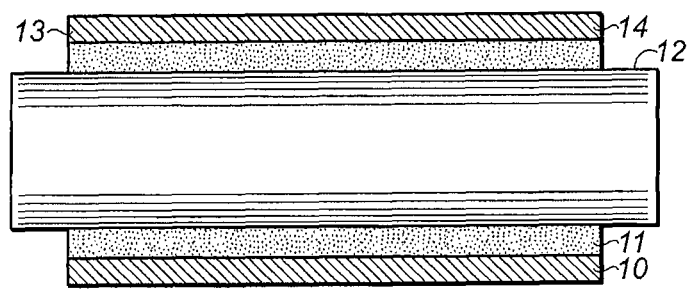
FIG. 1 is a partial cross-sectional view of a rotary sputtering target assembly according to the prior art and as described above.
Figure 2:
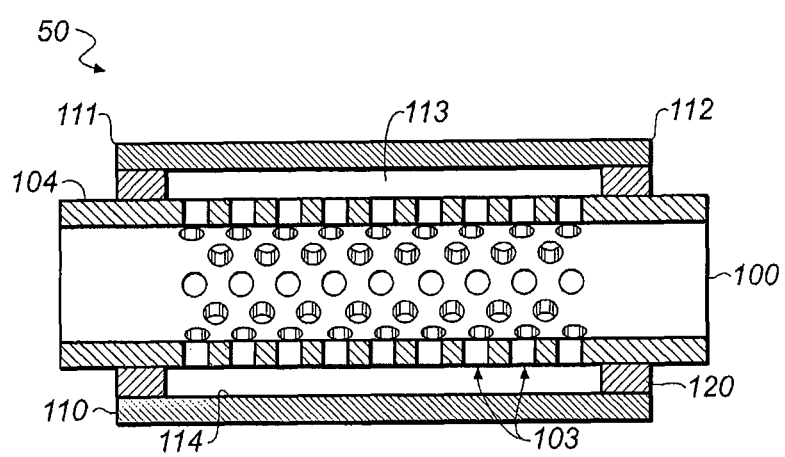
FIG. 2 is a cross-sectional view of a rotary sputtering target assembly according to the invention, and in which a gap is created between the perforated backing tube and the rotary target that is affixed to the backing tube.

As shown in FIG. 2 and according to the invention, a rotary sputtering target assembly 50 includes a gap 113 of uniform depth between a backing tube 100 and a sputtering target 110 of the desired material to be sputtered as a thin film onto the surface of a substrate. The backing tube 100 contains one or more but preferably a substantial number of perforations 103 as are illustrated in more detail in the co-pending '825 Application. The perforations 103 allow for a liquid or gaseous cooling fluid during the sputtering operation to contact directly the inner surface 114 of the target 110 by flowing into and through gap 113. More efficient cooling is achieved in that heat generated within target 110 during sputtering isn't required to be transferred to the cooling fluid mainly through the backing tube 100.

To form the gap as shown in FIG. 2, a discontinuous bonding material 120 located only at the ends of target 110 is of a length sufficient to affix the target rigidly in position to the backing tube so as not to become distorted during sputtering, yet forming a layer of sufficient thickness to contain the gap 113 at its optimum and uniform depth. Although the size of the gap 113 in FIG. 2 is somewhat exaggerated for illustrative purposes, the gap in practice may generally be between 1 mm and 3 mm in depth. The dimensions of the other features of the invention in all of the figures also are modified for illustrative purposes.

To complete the rotary sputtering target assembly, a target material is extruded forming a hollow cylinder of the desired inner and outer diameters and cut to the desired length. The inner diameter may be bored to form a smooth surface that conforms with necessary tolerances, at least at the ends to assure a firm bonding or intimate contact with any of the bonding means to be described. The target material is slid over the perforated backing tube, held in a fixed position while maintaining a uniform annular spacing between the target and the backing tube equal to the depth of gap 113, and then affixed to the backing tube by one of the described means. The method of assembly used may be similar to that as described in the co-owned '825 Application.

The bonding material 120 used to bond the rotary sputtering target 110 to the backing tube 100 generally has a high strength to weight ratio compared to the sputtering material, but this is not necessary in all applications. Suitable bonding materials include, but are not limited to solder type materials and foils, including bismuth type materials, indium, tin and alloys of indium/tin, silver/tin and similar alloys or epoxies. The bonding material should be selected based on the material properties of the rotary target and the backing tube to adhere firmly to both the target and backing tube, and have structural properties sufficient to retain a uniform gap throughout the sputtering process. The bonding materials should be suitable for service in a vacuum—needing to be stable and not outgas or decompose while exposed to a vacuum—properties of which will be known to those in the art. In addition to its bonding and structural properties, the bonding material to be used also must be of a density to maintain when in the sputtering chamber a vacuum to water seal sufficient to resist the pressure and leakage of the cooling fluid during the sputtering process.

As will be described, the application of the bonding material 120 only at the target ends also allows for easier and a cleaner separation from the backing tube of the remaining target material after the bulk of the target material is consumed in the sputtering process.

As known in the art, many materials can be used as rotary sputtering target materials. Suitable materials include, but are not limited to alloys, mixtures, pure metals, ceramics, oxides, nitrides, borides, carbides, fluorides and sulfides. In addition to depositing thin films of the target materials, an oxide or nitride thin film layer may be formed on a substrate by oxidizing or nitriding sputtered metal ions from a metal target as they are separated from the target. The substrate being treated may be physically or chemically masked if it is to be treated in only selected surface areas, and alternatively to the deposition of a thin film on the substrate, an appropriate target material may be used to treat the substrate surface either entirely or by etching in unmasked areas. It is understood that these sputtering techniques do not constitute an exhaustive list of possible sputtering techniques and that particular sputtering techniques will depend on the sputtering target and substrate materials, as will be known in the art.

The size of the rotary sputtering target assembly can vary greatly in the lengths and diameters of its backing tube and target components, depending, e.g., on the choice of the material to be sputtered, the width, composition and shape of the substrate on which the sputtered material is to be deposited, and the sputtering system to be used. Current systems employ rotary sputtering targets having lengths from about 16 inches to about 152 inches, inner diameters from about 2 inches to about 8 inches, and outer diameters from about 4 inches to about 9 inches. According to the invention, the combined bonding material at both ends generally will be contained on only about 15 to 20 percent of the overall length and inner surface area of target 110, but in certain circumstances for softer sputtering materials may comprise up to about 30 percent or even up to 50 percent of the overall length of target 110.

As sputtering and other vapor deposition systems using rotary targets evolve, so will the preferred sizes of the targets and backing tubes. The dimensions given herein are for explanatory purposes only, and are not intended to be limiting of the invention as described, it being understood that the invention can be employed in substantially all such variations in which rotary deposition using internal liquid or gaseous state cooling fluids are a preferred process.

In alternative embodiments, the rotary sputtering target 110 may be affixed to the backing tube 100 without using a thick bonding material, but using instead short tubular sleeves or preformed bonding rings, or enlarged end caps that are affixed to the backing tube and the target ends by adhesives or epoxies, welding, brazing, and/or threading.

Figure 3:
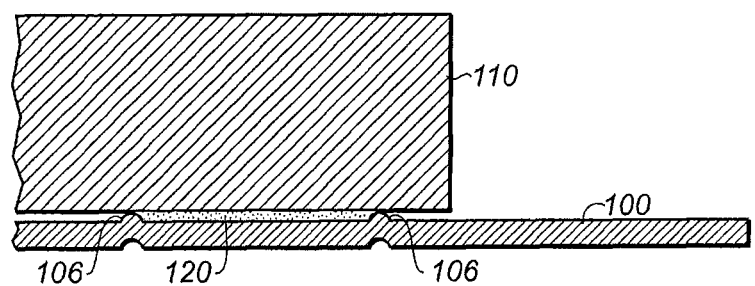
FIG. 3 is a cross-sectional view of a perforated backing tube having one or more ridges at each end of the tube, the ridges both to define the depth of the gap and to limit the flow or positioning of the affixing adhesive or bonding material to the defined target ends.

Referring to FIG. 3 there is shown a backing tube 100 that has on its outer surface annular ridges 106 at the bonding ends under target 110, both to contain the bonding adhesive to the area between the two ridges 106 to facilitate bonding of the target 110, and to define the depth of the cooling gap 113. Alternatively, the annular adhesive-containing ridges may be formed on the inner diameter of the target 110, although this alternative structure may limit the methods used to produce the sputtering target.

The ridges 106 may be machined integral with or welded to the backing tube 100 to provide self-alignment for the bonding material 120. If in roll or strip form, the bonding material is wrapped between the ridges and optionally held into place by soldering or tack welding. The backing tube is then inserted into the target, the ridges protecting the bonding material from tearing or migrating. Once the target is in place over the backing tube, the bonding material can be heated to form the bond between the backing tube and the target.

Figure 4:
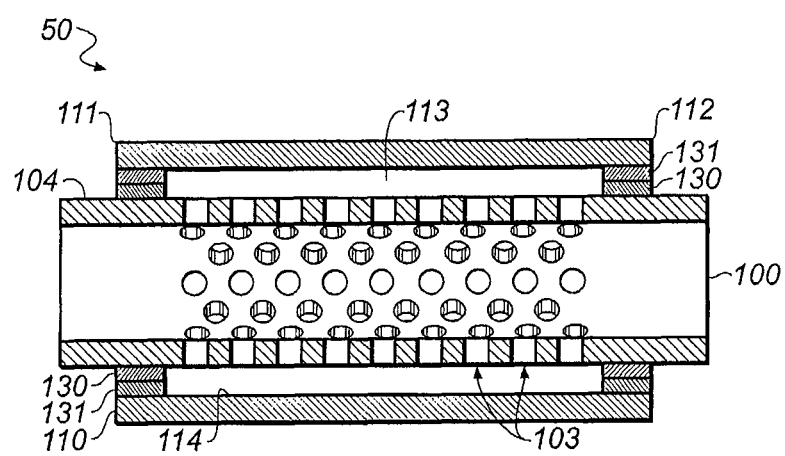
FIG. 4 is a cross-sectional view of a perforated backing tube on which the rotary target is affixed to the backing tube with bonding rings located at the ends of the target and between the target and backing tube.

In FIG. 4, there is shown a rotary sputtering target assembly 50 having a backing tube 100 with a target 110 affixed by bonding rings 130, 131 (exaggerated in thickness for illustrative purposes) to provide the attachment points and define the optimum uniform depth of the gap. The bonding rings can be attached by any suitable means, including, but not limited to, welding, friction welding, bonding, explosive bonding, diffusion bonding, soldering or brazing or by use of an adhesive. The bonding rings can be sized of different lengths and thicknesses for particular applications, if the same backing tube is used with target materials requiring gaps of different depths. FIG. 4 also demonstrates that stacked bonding rings may be used if because of the different material properties of the backing tube and the target a single bonding material will not provide a reliable and secure bond. Thus, rings of different materials are provided, in which the lower bonding ring 130 is of a material that will form a reliable bond with the backing tube 100 and with the upper bonding ring 131, and the upper bonding ring 131 also provide a reliable bond with the target 110.

Figure 5:
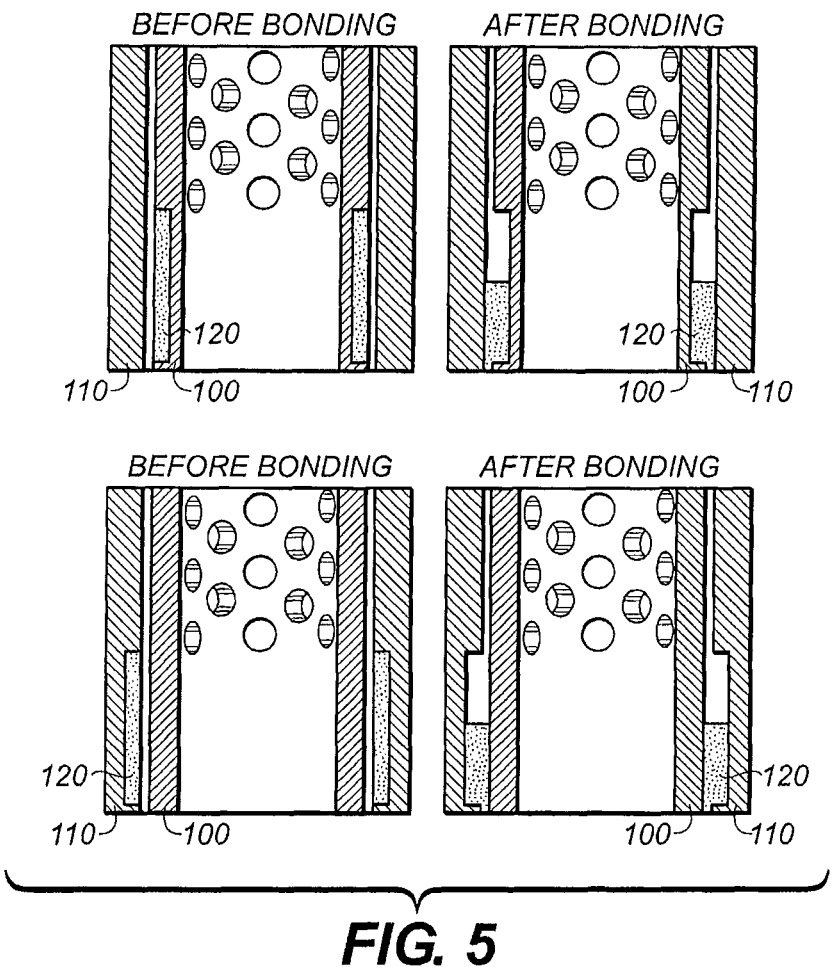
FIG. 5 illustrates a target bonded to a backing tube having relief reservoirs holding the bonding material to the target ends.

As an alternate method for attaching target 110 to backing tube 100, shown in FIG. 5, backing tube 100 is made with a relief reservoirs 105 formed into its circumference and used to retain bonding materials 120 within their designated lengths. As described in the co-pending '825 Application, the bonding material 120 is filled into the relief reservoir, which may be wetted prior to filling to facilitate flow of the bonding material. After the target tube 110 is aligned around the backing tube 100 as described, heat is applied to the bonding material 120, whether through the backing tube, the target or both, thereby allowing the bonding material 120 to flow into and fill at the target ends the gap formed between the backing tube. 100 and the target material 110. If during assembly the target and backing tube are in a vertical position, the bonding material melts during the heating, and gravity or capillary action causes the bonding material to flow into the gap at the target ends to fix the gap depth and form the required tight seal. Alternatively, the relief reservoirs may be located on the inner surface of the target at its two ends, or both the backing tube and target ends may include mating reservoirs.

If the bonding material 120 is in a viscous form, the bonding can be accomplished as described in the co-pending '825 Application, it being understood that bonding rings 130, retainer ridges 106 or any other material could form the optimal separation between the backing tube 100 and the target 110 to define the depth of gap 113. Once the target material 110 and backing tube 100 are aligned, the bonding material 120 is caused to flow into its defined space between the rings or ridges and heated to form the bond and hermetically seal the rotary sputtering assembly.

Figure 6:
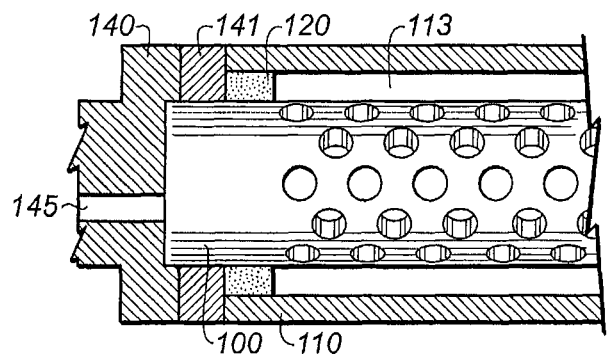
FIG. 6 conceptually illustrates alternate means for affixing the target to the perforated backing tube with end caps or rings and to the sputtering apparatus.

As partially shown in FIG. 6, annular unperforated end caps 140 of the same or a different material as the backing tube 100 are attached to the backing tube 100. If the end caps are of a material that will provide a hermetic seal with the target material 110, an unperforated ring 141 made of the sputtering material is inserted and preferably bonded to the tubular target 110. Although only conceptually shown because of the variety of different supporting apparatus connection means, end caps 140 may include one or more cooling fluid passages 145 to enable the flow of the cooling fluid through the interior of the backing tube 100 and the gap 113. If end cap 140 is not affixed to the backing tube but in use remains stationary while the target assembly rotates during sputtering, then a suitable compression gasket 150 (not shown) will be provided between end cap 140 and ring 141. On the other hand, if the sputtering apparatus is of the "one post" kind in which the attachment of the sputtering target to the apparatus is made at only one end, then in lieu of a ring 141 at the other end, the other end preferably will be closed by a solid cylindrical end cap made of the sputtering material and optionally include an alignment post on its axis for rotational support in an annular bearing in the sputtering apparatus chamber.

Those skilled in the art will understand how the sputtering target assembly ends are to be specifically designed for rotatable mounting in specific rotary sputtering apparatus, and whether in horizontal or vertical orientation and whether the cooling fluid inlet(s) and outlet(s) are at the same or opposite ends. Only a few of the known prior art mounting configurations to be identified herein for reference purposes are described in U.S. Pat. No. 8,182,662 issued May 22, 2012 to Crowley; and U.S. Published Patent Applications No. 20080087541, Dellaert et al, published Apr. 17, 2008; and No. 20080202925, Dellaert et al, published Aug. 28, 2008.

During the sputtering process, the cooling fluid must be retained within the rotary sputtering target assembly and not leak into the vacuum of the sputtering chamber. Should a leak develop, or cooling fluid leak into the sputtering chamber, effective sputtering can no longer be achieved. To prevent leakage, a hermitic seal between the perforated backing tube and the rotary sputtering target is needed to retain cooling fluid within the rotary sputtering target assembly during sputtering operations. Because of the perforations and cooling fluid is enabled to flow outside of the backing tube, a complete hermetic seal must be maintained to prevent any leakage of cooling fluid from the gap and into the sputtering chamber. For example as described in the '825 Application, a gasket or elastomer sealing ring surrounding the outer diameter of the backing tube 100 adjacent to the bonding area on either end is compressed during assembly to enhance its sealing properties during sputtering.

As noted earlier, the backing tube material is generally selected from a material having a high strength, a low cost, and high thermal conductive properties. The backing tube 100 must be constructed of a material and have a thickness suitable to support the weight of the rotary sputtering target. Furthermore, the backing tube should be vacuum compatible so as not to undergo a phase change in systems utilizing vacuum chambers. In selecting a backing tube material, it is important to use a material that will allow the bonding material or an adhered tubular sleeve to create both a sufficiently strong bond and an effective fluid seal. Generally, backing tubes are constructed from a non-magnetic material so as to not affect the magnetic field often used in the sputtering process. Suitable backing tube materials include, but are not limited to stainless steel, aluminum and titanium.

Also as described in the '825 Application, the backing tube in preparation for bonding is then inserted into the rotary sputtering target, but according to this invention, the spacing between them is sufficiently enlarged to establish the gap 113 is its optimum depth. If bonding rings or ridges are not used, the gap may be set by other suitable means, such as tapered or square shims having a thickness that matches the size of the enlarged gap.

The bonding material may be placed on the backing tube prior to its insertion into the target material, or the bonding material may be placed in (if in solid form) or flowed into (if a viscous material) the gap created during bonding preparation. If the bonding material is in the solid tape or sleeve form, it may be held in place until final bonding by spot solder or weld points, or by a heat resistant tape.

Optionally, the backing tube may be coated with a release agent to facilitate the release of the remaining target material from the backing tube after use. The release agent is applied proximate to but not on the area of the backing tube where the bonding material is applied. The release agent impedes the bonding material from bonding to the backing tube in the areas in which the release agent is applied. Those skilled in the art will understand that the temperature of the particular sputtering system must be considered in selecting an appropriate release agent. Suitable release agents include, but are not limited to bee's wax, graphite based alcohols, graphite based paints, dry graphite lubricants such as Acheson DAG 154, and other compounds commonly used throughout the solder industry to prevent the bonding material from adhering to areas of the backing tube not intended to have bonding material. Graphite based alcohols are used for their ease of application, in that the alcohol is evaporated and will leave behind a graphite film that prevents adhesion of the bonding material to the backing tube during recycling.

Referring again to FIG. 2, the exposed end portions 104 of the backing tube in the rotary sputtering target assembly 50 provide the means for attachment of the target assembly to a sputtering system, and will have a configuration appropriate to the attachment means on the sputtering system and the connection to the system's cooling fluid source. For example, each end 104 of the backing tube 100 will include unperforated end caps 140 to facilitate the attachment to the sputtering system, with at least one of the caps 140 containing the means for the intake and exhaust of the cooling fluid into and from the interior of the backing tube.

As described in the '825 Application, backing tube 100 may be formed in one or more layers from a perforated sheet material that is helically wound and welded, which allows for a streamlined method for manufacturing backing tubes of various lengths and diameters. Although the helical shape for any specific weight/gauge sheet material may provide the most resistance to flexing during sputtering, the backing tube also may be formed from a perforated sheet material having a length equal to the backing tube length and which is rolled with its longitudinal edges mated and welded together to form a seam along the length of the backing tube, or the backing tube may be cut from lengths of a perforated tubular stock. For each of those methods of manufacture, sleeves such as those described earlier may be used to cover any perforations as may be present under the bonding material, or those perforations filled in during the welding process, if it is desired that the bonding material not penetrate the backing tube during assembly.

The backing tube perforations 103 that enable the cooling fluid to flow through the gap 113 and directly contact the target 110 can be any size, shape or pattern, so as to allow cooling fluid to pass through the perforations while maintaining the integrity of the backing tube 100. The perforations can be holes, slots, slits or any opening and of various sizes to optimize flow characteristics. Typically, the perforations will be located only in the portion of annular surface area of the backing tube contiguous to the area of the gap 113 and will constitute between 20% and 75% of the total surface area of that portion, and preferably between about 40% and 60% of that surface area. More or less perforations, the perforation sizes and the perforated area will depend on the sputtering material, the sputtering equipment and its ionizing process, the sputtering rate, the cooling fluid used, and the fluid flow rate through the gap 113.

An important aspect of the invention is the ability of the invention to obtain significantly higher production rates when used in a multi-station sputtering apparatus for sequentially depositing thin films of different materials in linear succession on the same substrate. As one example, it is known to deposit multiple thin film layers on large planar substrates such as architectural and automotive glass, as well as on rigid and flexible polyester substrates used in a wide variety of applications. If a float glass substrate, the thin film layers may be sputter deposited on the substrate, either in the same or in an adjacent production line to the glass substrate production line. For this process, the thin film layers may first include a thin film barrier of, e.g., chromium, a silicon-aluminum alloy, or titanium, followed by a thin semi-reflective film of, e.g., silver, gold, copper or their alloys superimposed on the first layer, and then sequentially superimposed on those layers a UV absorption or reflective coating of, e.g., a zinc oxide and followed by a protective layer of, e.g., nickel chromium, a silicon-aluminum alloy or a silicon nitride. A typical prior art sputtering apparatus to deposit the thin film layers on the glass substrate will have multiple in-line sputtering stations, each station causing atoms from the installed sputtering target to be deposited in a thin film of a thickness measured in nanometers, as the substrate moves at a constant rate under that sputtering station. To achieve the total desired thickness for each of the four thin film layers, multiple adjacent stations installed with the same sputtering material will be used, such that the sum of the sequentially deposited films for each material will equal the desired layer thickness for that material, also measured in nanometers Given that the four thin film layers will have different design thicknesses, the atoms for the different materials will be deposited at different rates, and the substrate will move under all of the sputtering stations at the same rate, the number of sputtering stations assigned to each material will be selected to optimize both the respective layer thicknesses and the overall coating time.

Using in this example known prior art sputtering targets in a twenty-four station sputtering apparatus, an optimized process will have the barrier material targets installed in the first six stations, the semi-reflective material in the next four stations, the UV layer in the following eight stations, and the final protective layer in the remaining six stations. Because of the increased efficiency of sputtering target assemblies according to this invention to be used with the semi-reflective and UV layers, the rate of deposit for the semi-reflective layer can be as much as doubled, and the UV layer by as much as a third when compared to the slower barrier and protective layers. Thus, the desired thickness for the semi-reflective layer can be achieved using only two stations and the UV layer using only six stations Each pair of the other two "extra" stations can now be assigned to the slower bottom barrier and the top protective layers, in which case the substrate speed can be increased by as much twenty five or more percent and still obtain the desired layer thicknesses for all of the thin film layers by reason of the faster deposits of the semi-reflective and UV materials and the more stations assigned to the other two slower materials.

As can be understood from the foregoing description, the invention includes a method for depositing target material comprising the steps of installing, in a deposition chamber with a connection to a cooling fluid source, a rotary target assembly as described above, rotating the target assembly and while rotating it subject the target to negative ions to dislodge atoms of the target material to be deposited on a substrate either as a thin film layer or to treat the substrate surface, flowing cooling fluid into the inner surface of the perforated backing tube and through the plurality of perforations to directly contact the inner surface of the target, and exiting the heated cooling fluid from the interior of the target assembly. Because of the significantly improved cooling, the rate of deposit of atoms of the target material can be very significantly increased for many such materials, and thus the overall coating production process made significantly more efficient.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention. Therefore, it is intended that the invention not be limited to the particular embodiments disclosed as the best mode contemplated for carrying out this invention, but that the invention will include all embodiments falling within the scope and spirit of the appended claims.

PARTS LIST

Prior Art

10 Sputtering target
11 Bonding material
12 Backing tube
13 and 14 Sputtering target ends Invention

50 Rotary sputtering assembly
100 Backing tube
103 Perforations

104 Exposed backing tube
105 Relief reservoir
106 Bonding ridge
110 Sputtering target
111 First sputtering target end
112 Second sputtering target end
113 Gap
114 Inner surface
115 Sealing ring
117 Sleeve
120 Bonding material
130 Bonding ring
131 Bonding ring
140 Threaded end cap
141 Bonding material ring
145 Cooling fluid passage
150 Gasket

The invention claimed is:

1. A rotary thin film deposition target assembly comprising:
   a hollow backing tube having a length, an outer surface, an outer diameter, and a plurality of perforations around the periphery of the tube and along the substantial portion of the periphery;
   a tube shaped rotary deposition target having a length less than the length of the backing tube with its inner annular surface having a diameter larger than the outer diameter of the backing tube and positioned over and between the ends of the backing tube;
   means for bonding the target only at one or both ends of the target; and
   an annular gap of uniform depth between the backing tube and target and having a length substantially equal to the length of the perforated portion of the backing tube, the gap being in fluid communication with the interior of the backing tube through the perforations.

2. The rotary deposition target assembly of claim 1, wherein the gap has a uniform depth of between 1 mm and 3 mm.

3. The rotary deposition target assembly of claim 1, wherein the bonding means is applied on substantially the entire periphery of the deposition target ends and covering from between 15% and 20% of the length of the deposition target.

4. The rotary deposition target assembly of claim 1, further comprising an annular relief reservoir recessed into at least one end of either or both the perforated backing tube on its outer surface and the deposition target on its inner surface to receive the bonding means.

5. The rotary deposition target assembly of claim 4 and further comprising two annular protruding ridges proximate at least one end of the perforated backing tube, the protruding ridges engaging the inner surface of the deposition target to define the depth of the gap and retaining the bonding means between the two ridges.

6. The rotary deposition target assembly of claim 1, wherein said bonding means comprises a material selected from the group consisting of indium, indium-tin alloy and silver-tin alloy.

7. The rotary deposition target assembly of claim 1, wherein said plurality of perforations comprise between 20% and 75% of the total annular surface area of the perforated backing tube between the bonded ends of the target.

8. The rotary deposition target assembly of claim 1, wherein the perforations and gap enable a cooling fluid during use of the target assembly to flow through the gap and contact directly the entire inner surface of the deposition target between the bonded ends, and the bonding means comprises a material that provides a hermetic seal between the perforated backing tube and the rotary deposition target to retain the cooling fluid within the rotary deposition target assembly as the fluid flows through the gap.

9. The rotary deposition target assembly of claim 8, wherein the hermetic seal is selected from the group consisting of a welded seal, a bonded seal and a gasket seal.

10. The rotary deposition target assembly of claim 1, wherein the deposition target consists essentially of a material that is deposited on a substrate by sputtering in which the material is bombarded in a sputtering chamber with negative ions to dislodge atoms of the material from the target, and the bonding means is retained at one or both ends of the target by an annular relief reservoir or annular protruding ridges.

11. The rotary deposition target assembly of claim 3, wherein the deposition target consists essentially of a material that is deposited on a substrate by sputtering in which the material is bombarded in a sputtering chamber with negative ions to dislodge atoms of the material from the target, and the plurality of perforations comprise between 20% and 75% of the total annular surface area of the perforated backing tube between the bonded ends of the target.

12. The rotary deposition target assembly of claim 8, wherein the deposition target consists essentially of a material that is deposited on a substrate by sputtering in which the material is bombarded in a sputtering chamber with negative ions to dislodge atoms of the material from the target, the cooling fluid is a liquid, and the bonding means is selected from the group consisting of bismuth type materials, indium, tin and alloys of indium/tin and silver/tin.

13. The rotary deposition target assembly of claim 12, wherein the bonding means is applied on substantially the entire periphery of the deposition target ends and covering from between 15% and 20% of the length of the deposition target, and the plurality of perforations comprise between 20% and 75% of the total annular surface area of the perforated backing tube between the bonded ends of the target.

14. A method for manufacturing a rotary deposition target comprising the steps of:
   extruding a target material into a hollow cylindrical shape having an inner surface and an outer surface, then cutting the extruded material to a desired length having first and second ends to form a deposition target;
   boring at least the ends of the inner surface of the target to form a smooth bonding surface;
   sliding the target onto a circumferentially perforated backing tube, the perforated backing tube an outer diameter less than the inner diameter of the target material and having a length that is greater than the length of the target material, with at least the end portions of the backing tube extending beyond the target ends not being circumferentially perforated; and
   affixing the target only at its ends to the perforated backing tube such that a uniform annular gap exists between the inner annular surface of the target and the outer annular surface of the backing tube along at least seventy percent of the entire length of the target.

15. The method for manufacturing a rotary deposition assembly according to claim 14, in which the step affixing the target material to the perforated backing tube is by a hermitic seal between the perforated backing tube and the target to retain cooling fluid within the rotary deposition assembly when the assembly is in use in a deposition system.

16. A method for deposition of a thin film of a material onto a moving substrate comprising the steps of (a) installing in a deposition chamber a rotary deposition target assembly comprising a hollow backing tube having a length, an outer surface, an outer diameter, and a plurality of perforations around the periphery of the tube and along the substantial portion of the periphery, a tube shaped rotary deposition target having a length less than the length of the backing tube with its inner annular surface having a diameter larger than the outer diameter of the backing tube and positioned over and between the ends of the backing tube, means for bonding the target only at one or both ends of the target; and an annular gap of uniform depth between the backing tube and target and having a length substantially equal to the length of the perforated portion of the backing tube, the gap being in fluid communication with the interior of the backing tube through the perforations;

(b) connecting the target assembly on at least one end of the backing tube to a fluid cooling source;

(c) rotating the target assembly in an inert atmosphere while bombarding the target with ions to detach atoms from the target and deposit them on the substrate passing under the target;

(d) flowing cooling fluid from the source into the interior of the perforated backing tube and through the plurality of perforations to directly contact the entire inner surface of the target adjacent to the gap between the perforated backing tube and the target to cool the target; and (e) continuing the flow of the heated cooling fluid to exit the target assembly.

17. The method of claim 16, wherein the deposition target material is selected from a group of materials in which the atoms of the material either (a) form a thin film of the material on the substrate surface, (b) treat the substrate surface to change the physical and/or chemical properties of the substrate surface, or (c) etch the substrate surface.

18. The rotary deposition target assembly of claim 1, wherein said plurality of perforations comprise between 40% and 60% of the total annular surface area of the perforated backing tube between the bonded ends of the target.

19. The rotary deposition target assembly of claim 3, wherein the deposition target consists essentially of a material that is deposited on a substrate by sputtering in which the material is bombarded in a sputtering chamber with negative ions to dislodge atoms of the material from the target, and the plurality of perforations comprise between 40% and 60% of the total annular surface area of the perforated backing tube between the bonded ends of the target.

20. The rotary deposition target assembly of claim 12, wherein the bonding means is applied on substantially the entire periphery of the deposition target ends and covering from between 15% and 20% of the length of the deposition target, and the plurality of perforations comprise between 40% and 60% of the total annular surface area of the perforated backing tube between the bonded ends of the target.

* * * * *